United States Patent
Amano et al.

(10) Patent No.: US 10,643,865 B2
(45) Date of Patent: May 5, 2020

(54) SUBSTRATE CLEANING APPARATUS

(71) Applicant: Tokyo Electron Limited, Tokyo (JP)

(72) Inventors: Yoshifumi Amano, Koshi (JP); Yuki Ito, Koshi (JP); Kento Kurusu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 431 days.

(21) Appl. No.: 15/452,848

(22) Filed: Mar. 8, 2017

(65) Prior Publication Data
US 2017/0278728 A1    Sep. 28, 2017

(30) Foreign Application Priority Data

Mar. 22, 2016  (JP) .................... 2016-057366
Feb. 6, 2017   (JP) .................... 2017-019774

(51) Int. Cl.
*H01L 21/67*   (2006.01)
*B08B 3/02*    (2006.01)
*B08B 1/04*    (2006.01)
*B08B 1/00*    (2006.01)
*A46B 11/06*   (2006.01)

(52) U.S. Cl.
CPC ...... *H01L 21/67046* (2013.01); *A46B 11/066* (2013.01); *B08B 1/002* (2013.01); *B08B 1/007* (2013.01); *B08B 1/04* (2013.01); *B08B 3/024* (2013.01)

(58) Field of Classification Search
CPC .... B08B 1/04; B08B 3/00; B08B 3/02; B08B 3/022; H01L 21/6704; H01L 21/67046; H01L 21/67051

USPC .................. 15/21.1, 77, 88.2, 102
See application file for complete search history.

(56) References Cited

U.S. PATENT DOCUMENTS 5,806,126 A * 9/1998 de Larios ............... A46B 11/06
                                                15/102
6,093,254 A * 7/2000 Svirchevski ...... H01L 21/02052
                                                134/2
6,158,075 A * 12/2000 Tanaka .................... B08B 1/007
                                                15/102

(Continued)

FOREIGN PATENT DOCUMENTS

JP     3-52230      *  3/1991
JP     2007-243030  *  9/2007
JP     4685914 B       2/2011

*Primary Examiner* — Mark Spisich
(74) *Attorney, Agent, or Firm* — Pearne & Gordon LLP

(57) ABSTRACT

A substrate cleaning apparatus includes a substrate holding unit, a brush, an arm, a discharge portion and a guide member. The substrate holding unit is configured to hold a substrate rotatably. The brush has a main body, a cleaning body provided at a lower portion of the main body and configured to be pressed onto the substrate, and a hollow portion formed in the main body and provided with an open top and an open bottom. The arm is configured to rotatably support the main body with a spindle therebetween. The discharge portion is provided at the arm, and plural kinds of processing liquids are discharged from the discharge portion while being switched. The guide member is provided between the discharge portion and the brush, and is configured to receive the processing liquid discharged from the discharge portion and guide the received processing liquid into the hollow portion.

9 Claims, 13 Drawing Sheets

(56) References Cited

U.S. PATENT DOCUMENTS

| | | | | |
|---|---|---|---|---|
| 6,167,583 B1 * | 1/2001 | Miyashita | ......... | H01L 21/67028 15/77 |
| 6,308,361 B1 * | 10/2001 | Matsuda | ................... | B08B 1/00 15/102 |
| 2002/0035763 A1 * | 3/2002 | Hirose | ...................... | B08B 1/04 15/77 |

* cited by examiner

SUBSTRATE CLEANING APPARATUS

CROSS-REFERENCE TO RELATED APPLICATION

This application claims the benefit of Japanese Patent Application Nos. 2016-057366 and 2017-019774 filed on Mar. 22, 2016 and Feb. 6, 2017, respectively, the entire disclosures of which are incorporated herein by reference.

TECHNICAL FIELD

The embodiments described herein pertain generally to a substrate cleaning apparatus.

BACKGROUND

Conventionally, as one of substrate cleaning apparatuses of processing a substrate such as a semiconductor wafer, there is known a substrate cleaning apparatus configured to clean the substrate by bringing the brush into contact with the substrate and rotating the brush with respect to the substrate while supplying a processing liquid to the brush from the outside of the brush (Patent Document 1).

Patent Document 1: Japanese Patent No. 4,685,914

If, however, different kinds of cleaning liquids are supplied to the brush, there may be a problem such as generation of a salt caused by a reaction between plural chemical liquids supplied one after another. In the prior art, however, a solution to such a problem is yet to be considered.

SUMMARY

In view of the foregoing, exemplary embodiments provide a substrate cleaning apparatus capable of performing a cleaning process effectively even in case of supplying different kinds of cleaning liquids to a brush.

In an exemplary embodiment, a substrate cleaning apparatus includes a substrate holding unit, a brush, an arm, a discharge portion and a guide member. The substrate holding unit is configured to hold a substrate rotatably. The brush has a main body, a cleaning body provided at a lower portion of the main body and configured to be pressed onto the substrate, and a hollow portion formed in the main body and provided with an open top and an open bottom. The arm is configured to rotatably support the main body of the brush with a spindle therebetween. The discharge portion is provided at the arm, and plural kinds of processing liquids are discharged from the discharge portion while being switched. The guide member is provided between the discharge portion and the brush and is configured to receive the processing liquid discharged from the discharge portion and guide the received processing liquid into the hollow portion of the brush.

According to the exemplary embodiment, it is possible to provide the substrate cleaning apparatus capable of performing the cleaning process effectively even in case of supplying the different kinds of cleaning liquids to the brush.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
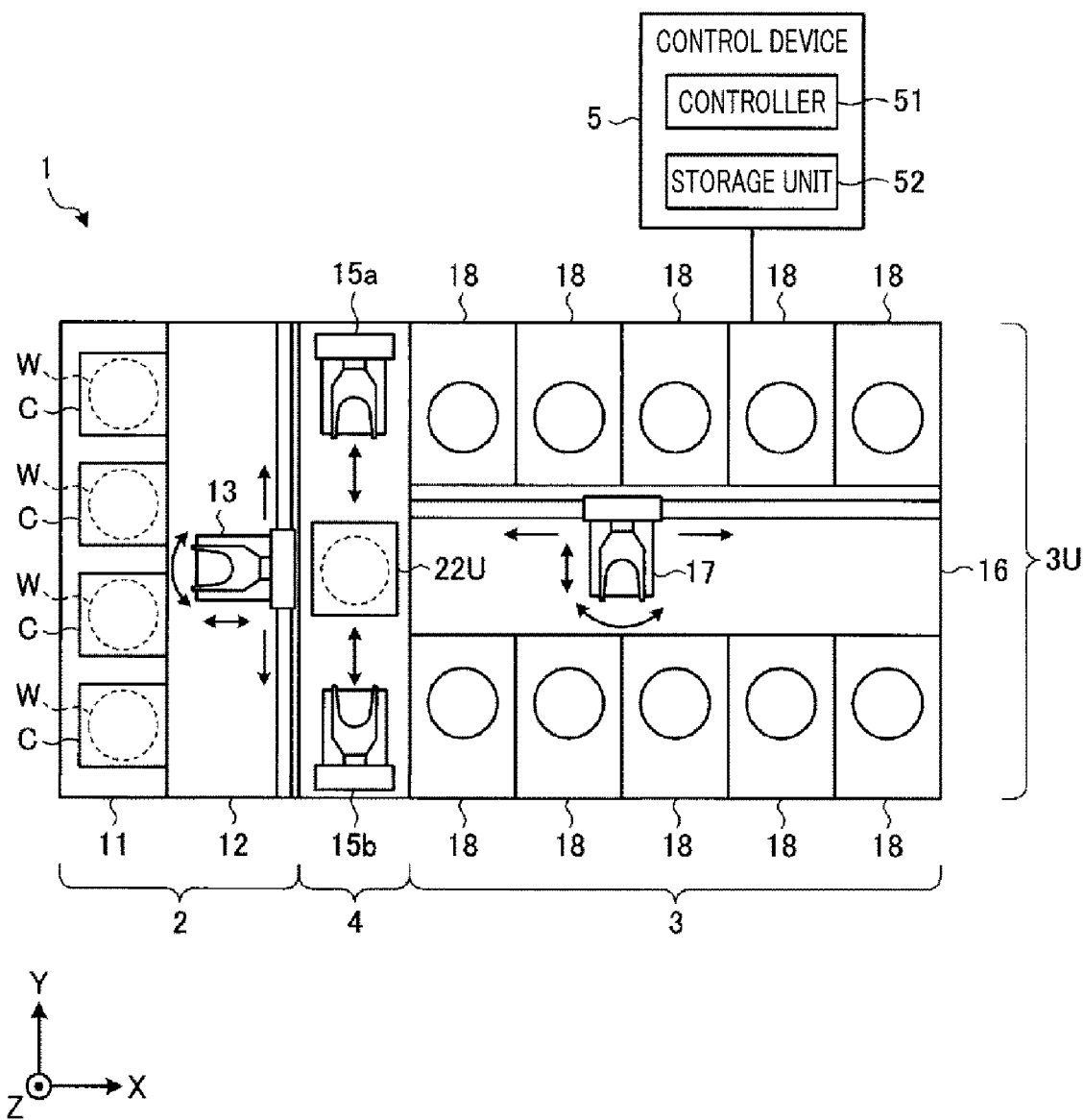
FIG. 1 is a schematic plan view of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments of a substrate processing apparatus will be explained in detail with reference to the accompanying drawings. Further, the present disclosure is not limited to the following example embodiments.

First Exemplary Embodiment

<Configuration of Substrate Processing System>

Figure 2:
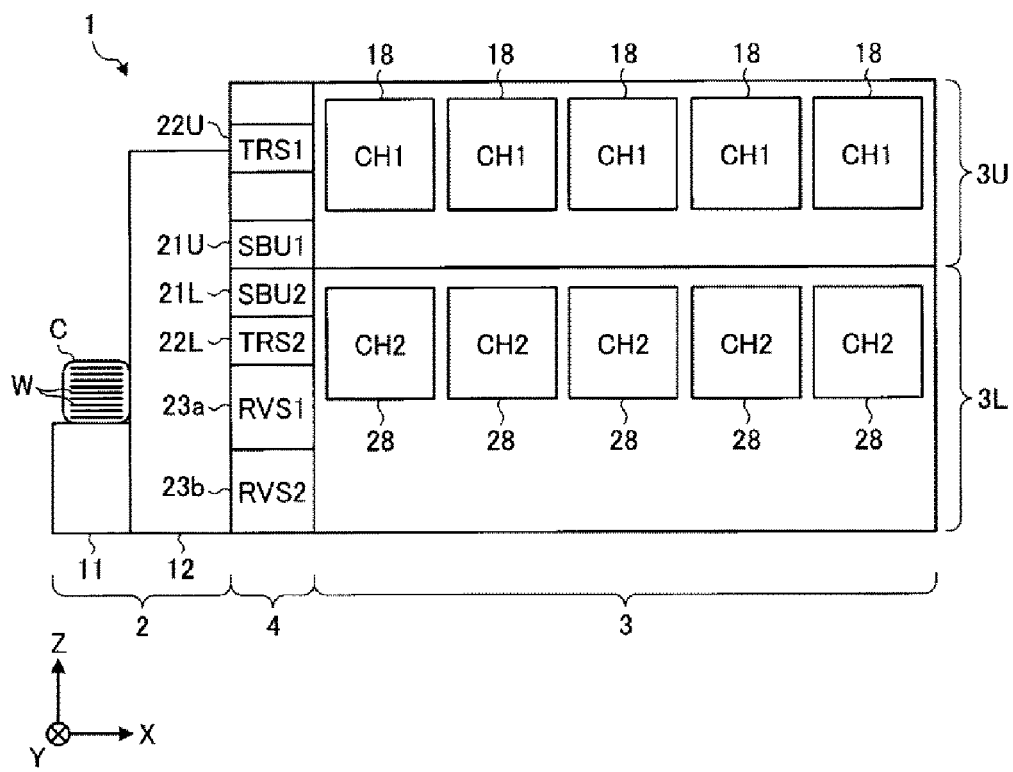
FIG. 2 is a schematic side view of the substrate processing system according to the first exemplary embodiment.

First, a configuration of a substrate processing system 1 according to a first exemplary embodiment will be described with reference to FIG. 1 and FIG. 2. FIG. 1 is a schematic plan view of the substrate processing system 1 according to the first exemplary embodiment. Further, FIG. 2 is a schematic side view of the substrate processing system 1 according to the first exemplary embodiment. Further, in the following description, in order to clarify positional relationships, the X-axis, Y-axis and Z-axis which are orthogonal to each other will be defined. The positive Z-axis direction will be regarded as a vertically upward direction.

As depicted in FIG. 1, the substrate processing system 1 according to the first exemplary embodiment includes a carry-in/out block 2, a processing block 3 and a delivery block 4. These blocks are arranged in the order of the carry-in/out block 2, the delivery block 4 and the processing block 3.

In the substrate processing system 1, a substrate, i.e., a semiconductor wafer (hereinafter, referred to as "wafer W") in the present exemplary embodiment is transferred from the carry-in/out block 2 into the processing block 3 via the delivery block 4, and then is processed in the processing block 3. Further, in the substrate processing system 1, the processed wafer W is returned back from the processing block 3 into the carry-in/out block 2 via the delivery block 4, and then is transferred from the carry-in/out block 2 to the outside. Hereinafter, configurations of the respective blocks 2 to 4 will be explained.

<Configuration of Carry-In/Out Block 2>

The carry-in/out block 2 includes a mounting unit 11 and a transfer unit 12. A plurality of cassettes C, each of which accommodates therein a multiple number of wafers W horizontally, is placed on the mounting unit 11.

The transfer unit 12 is positioned adjacent to the mounting unit 11 and is equipped with a main transfer device 13 therein. The main transfer device 13 is configured to transfer a wafer W between the mounting unit 11 and the delivery block 4.

<Configuration of Processing Block 3>

As depicted in FIG. 2, the processing block 3 includes a first processing block 3U and a second processing block 3L. The first processing block 3U and the second processing block 3L are spatially separated by a partition wall, a shutter, or the like, and are vertically arranged in a height direction. In the exemplary embodiment, the first processing block 3U is arranged at the upper level, and the second processing block 3L is arranged at the lower level.

In the first processing block 3U, a wafer W with its circuit forming surface (hereinafter, referred to as "front surface") facing upward is processed. Meanwhile, in the second processing block 3L, a wafer W with a rear surface, which is opposite to the front surface, facing upward is processed. Below, configurations of the first processing block 3U and the second processing block 3L will be described.

<Configuration of First Processing Block 3U>

The first processing block 3U includes, as depicted in FIG. 1, a transfer unit 16, a first transfer device 17 and a multiple number of first processing units 18. The first transfer device 17 is provided within the transfer unit 16, and the multiple number of first processing units 18 are arranged adjacent to the transfer unit 16 at the outside of the transfer unit 16.

The first transfer device 17 is configured to transfer a wafer W between the delivery block 4 and the first processing unit 18. To elaborate, the first transfer device 17 takes out a wafer W from the delivery block 4 and transfers the wafer W into the first processing unit 18. Further, the first transfer device 17 also takes out the wafer W processed by the first processing unit 18 from the first processing unit 18 and transfers the processed wafer W into the delivery block 4.

The first processing unit 18 is configured to perform a bevel cleaning process on a wafer W with a front surface thereof facing upward. Here, the bevel cleaning process refers to a process of removing a boat mark, a particle adhering to a peripheral portion (bevel portion) of the wafer W or the like.

By way of example, the first processing unit 18 includes an attracting/holding unit configured to attract and hold the wafer W rotatably; a bevel cleaning unit configured to clean the peripheral portion of the wafer W physically by bringing a brush into contact with the peripheral portion of the wafer W; and a discharging unit configured to discharge a chemical liquid toward the peripheral portion of the wafer W. This first processing unit 18 is configured to rotate the wafer W in the state that the rear surface of the wafer W with the front surface facing upward is attracted to and held by the attracting/holding unit. Further, the first processing unit 18 is configured to remove a particle adhering to the peripheral portion of the wafer by bringing the brush of the bevel cleaning unit into contact with the peripheral portion of the wafer W while discharging the chemical liquid toward the rear peripheral portion of the rear surface of the wafer W being rotated from the discharging unit. Thus, by combining the chemical cleaning with the chemical liquid and the physical cleaning with the brush together, it is possible to improve a removal efficiency of a particle, a boat mark, or the like.

<Configuration of Second Processing Block 3L>

Figure 3:
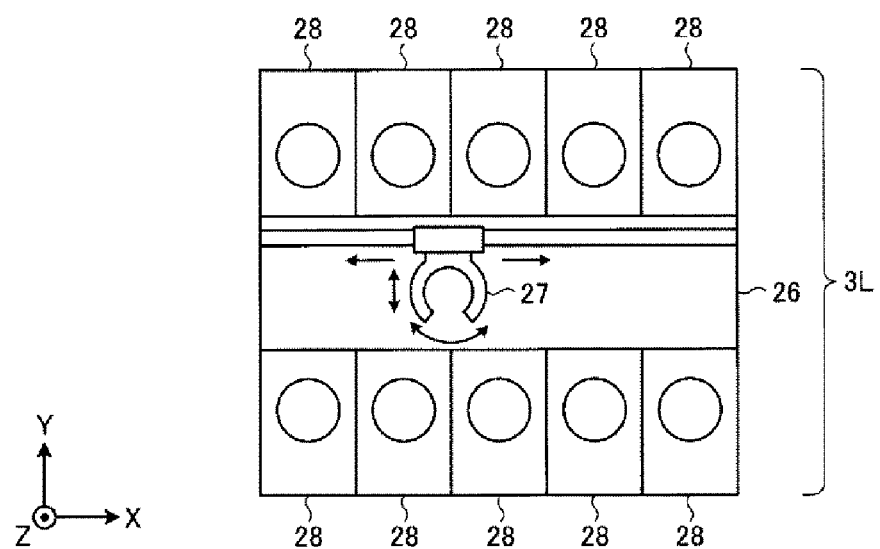
FIG. 3 is a schematic plan view of a second processing block.

Now, a configuration of the second processing block 3L will be discussed with reference to FIG. 3. FIG. 3 is a schematic plan view of the second processing block 3L.

As depicted in FIG. 3, the second processing block 3L includes a transfer unit 26, a second transfer device 27, and a multiple number of second processing units 28. The second transfer device 27 is provided within the transfer unit 26, and the multiple number of second processing units 28 are arranged adjacent to the transfer unit 26 at the outside of the transfer unit 26.

The second transfer device 27 is configured to transfer a wafer W between the delivery block 4 and the second processing unit 28. To elaborate, the second transfer device 27 takes out a wafer W from the delivery block 4 and transfers the wafer W into the second processing unit 28. Further, the second transfer device 27 also takes out the wafer W processed by the second processing unit 28 from the second processing unit 28 and transfers the processed wafer W into the delivery block 4.

Figure 4:
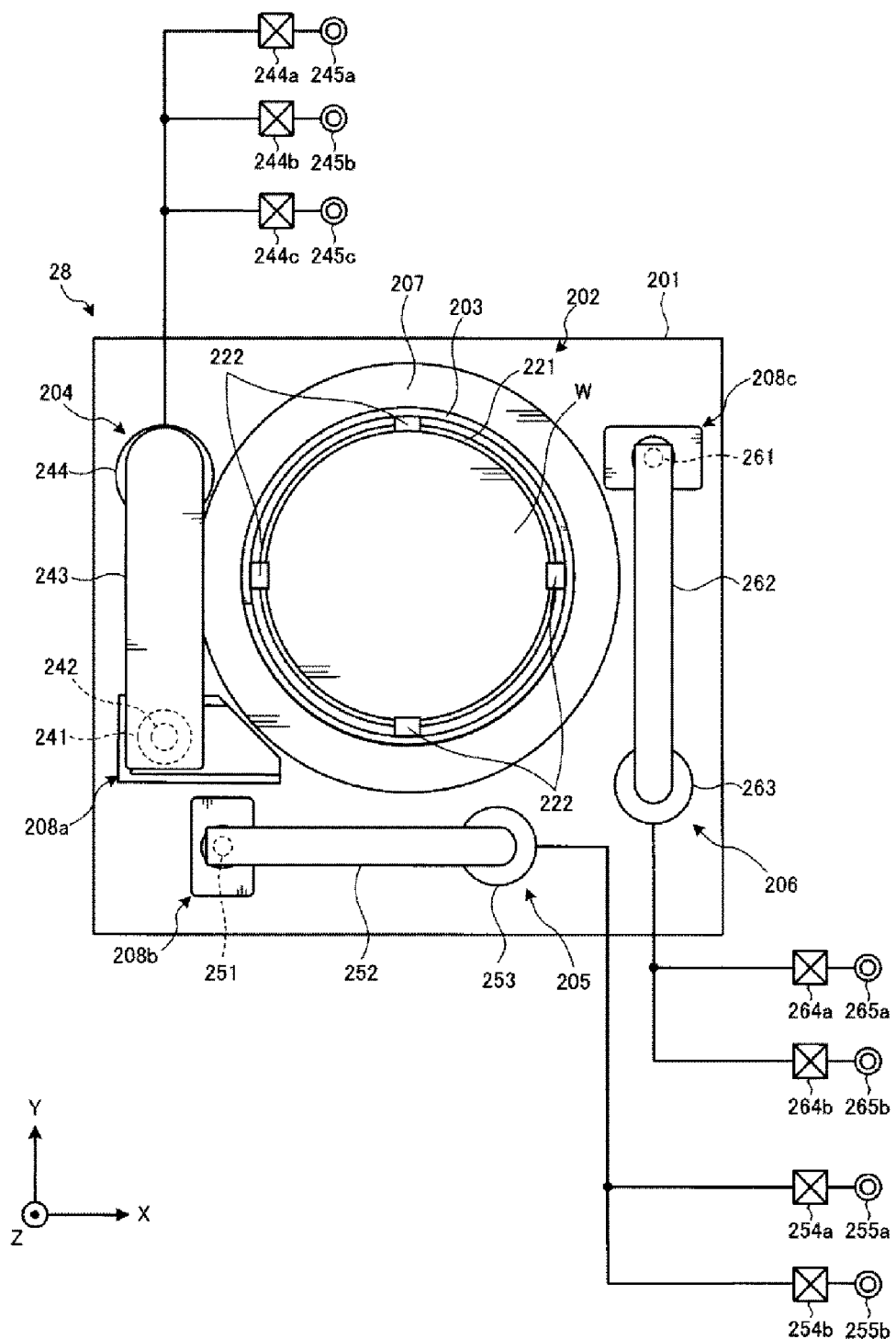
FIG. 4 is a schematic plan view of a second processing unit.

The second processing unit 28 is configured to perform a rear surface cleaning process of removing a particle or the like adhering to a rear surface of the wafer W with the rear surface facing upward. Here, a configuration of the second processing unit 28 will be explained with reference to FIG. 4 and FIG. 5. FIG. 4 is a schematic plan view of the second processing unit 28, and FIG. 5 is a schematic side view of the second processing unit 28.

Figure 5:
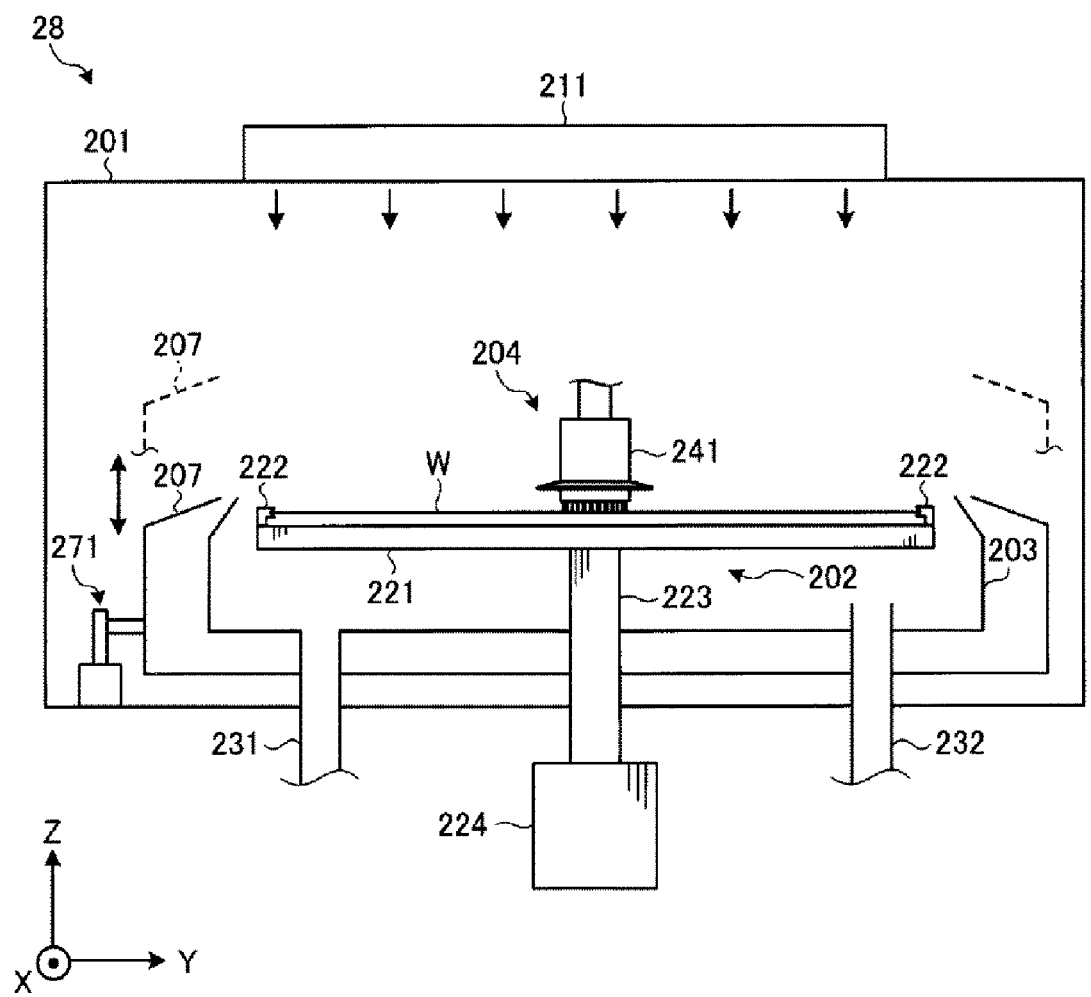
FIG. 5 is a schematic side view of the second processing unit.

As depicted in FIG. 4 and FIG. 5, the second processing unit 28 includes a chamber 201, a substrate holding unit 202, a recovery cup 203, a rear surface cleaning unit 204, a first supply unit 205, a second supply unit 206 and a surrounding wall 207.

The chamber 201 accommodates therein the substrate holding unit 202, the recovery cup 203, the rear surface cleaning unit 204, the first supply unit 205, the second supply unit 206 and the surrounding wall 207. A FFU (Fan Filter Unit) 211 configured to form a downflow within the chamber 201 is provided at a ceiling portion of the chamber 201.

The substrate holding unit 202 includes a main body 221 having a diameter larger than that of the wafer W; a plurality of grippers 222 provided on a top surface of the main body 221; a supporting column 223 configured to support the main body 221; and a driving unit 224 configured to rotate the supporting column 223. Further, the number of the grippers 222 is not limited to the shown example.

The substrate holding unit 202 having this configuration holds the wafer W by gripping a peripheral portion of the wafer W with the plurality of grippers 222. Accordingly, the wafer W is horizontally maintained slightly spaced apart from the top surface of the main body 221.

Furthermore, in the second processing unit 28, the rear surface cleaning process is performed on the wafer W with the rear surface facing upward, i.e., with the front surface facing downward. Thus, if a wafer holding structure configured to attract the wafer W, like the attracting/holding unit of the first processing unit 18, is applied to the second processing unit 28, the front surface of the wafer W which serves as the circuit forming surface may be contaminated. Thus, in the substrate processing system 1, to suppress contamination of the circuit forming surface, the substrate holding unit 202 is configured to grip the peripheral portion of the wafer W.

The recovery cup 203 is disposed to surround the substrate holding unit 202. A drain port 231 and an exhaust port 232 are provided at a bottom portion of the recovery cup 203. A chemical liquid discharged from the first supply unit 205 or the second supply unit 206 is drained to the outside of the chamber 201 through the drain port 231, and an atmosphere within the chamber 201 is exhausted through the exhaust port 232. Further, the second processing unit 28 may be further equipped with a device configured to switch a discharge destination of the chemical liquid discharged from the first supply unit 205 and a discharge destination of the chemical liquid discharged from the second supply unit 206.

The rear surface cleaning unit 204 includes a rear surface brush 241; an arm 243 extended in a horizontal direction (here, in the Y-axis direction) and configured to rotatably support the rear surface brush 241 from above with a spindle 242 therebetween; and a rotating/elevating device 244 configured to rotate and move the arm 243 up and down.

The rear surface cleaning unit 204 is connected to a first chemical liquid supply source 245a via a valve 244a, a flow rate controller (not shown), and the like, and is also connected to a second chemical liquid supply source 245b via a valve 244b, a flow rate controller (not shown), and the like. Further, the rear surface cleaning unit 204 is also connected to a rinse liquid supply source 245c via a valve 244c, a flow rate controller (not shown), and the like.

The rear surface cleaning unit 204 is configured to discharge a first chemical liquid supplied from the first chemical liquid supply source 245a, a second chemical liquid supplied from the second chemical liquid supply source 245b or a rinse liquid (here, pure water) supplied from the rinse liquid supply source 245c toward the wafer W from the inside of the rear surface brush 241 by respectively switching opening/closing of the valve 244a, the valve 244b or the valve 244c. A detailed configuration of this rear surface cleaning unit 204 will be elaborated later.

Here, the first chemical liquid is SC-1 (a mixed solution of ammonia, hydrogen peroxide and water), and the second chemical liquid is DHF (dilute hydrofluoric acid). However, it should be noted that the first chemical liquid is not limited to SC-1 and the second chemical liquid is not limited to DHF.

The first supply unit 205 is disposed outside the surrounding wall 207. The first supply unit 205 is equipped with a nozzle 251; a nozzle arm 252 extended horizontally and configured to support the nozzle 251 from above; and a rotating/elevating device 253 configured to rotate and move the nozzle arm 252 up and down.

The nozzle 251 is connected to a first chemical liquid supply source 255a via a valve 254a, a flow rate controller (not shown), and the like. Further, the nozzle 251 is also connected to a rinse liquid supply source 255b via a valve 254b, a flow rate controller (not shown), and the like. The first supply unit 205 discharges a first chemical liquid supplied from the first chemical liquid supply source 255a toward the wafer W by opening the valve 254a. Further, the first supply unit 205 discharges pure water supplied from the rinse liquid supply source 255b toward the wafer W by opening the valve 254b.

The second supply unit 206 is disposed outside the surrounding wall 207. The second supply unit 206 is equipped with a nozzle 261; a nozzle arm 262 extended horizontally and configured to support the nozzle 261 from above; and a rotating/elevating device 263 configured to rotate and move the nozzle arm 262 up and down.

The nozzle 261 is connected to a second chemical liquid supply source 265a via a valve 264a, a flow rate controller (not shown), and the like. Further, the nozzle 261 is also connected to a rinse liquid supply source 265b via a valve 264b, a flow rate controller (not shown), and the like. The second supply unit 206 discharges a second chemical liquid supplied from the second chemical liquid supply source 265a toward the wafer W by opening the valve 264a. Further, the second supply unit 206 discharges pure water supplied from the rinse liquid supply source 265b toward the wafer W by opening the valve 264b.

At an outside of the recovery cup 203, the surrounding wall 207 is disposed to surround the substrate holding unit 202. The surrounding wall 206 receives the processing liquid such as the first chemical liquid, the second chemical liquid and the pure water dispersed from the substrate holding unit 202. The surrounding wall 207 is connected to an elevating device 271 and is configured to be vertically moved by the elevating device 271. That is, the surrounding wall 207 is configured to be height-adjustable.

The second processing unit 28 is configured as described above, and rotates the wafer W with the rear surface facing upward while holding the peripheral portion of the wafer W by the substrate holding unit 202. The second processing unit 28 removes a particle or the like adhering to the rear surface of the wafer W by using the rear surface cleaning unit 204 and either one of the first supply unit 205 and the second supply unit 206.

Further, within the chamber 201 of the second processing unit 28, there are provided retreat positions where the rear surface brush 241 of the rear surface cleaning unit 204, the nozzle 251 of the first supply unit 205 and the nozzle 261 of the second supply unit 206 are placed after being retreated from above the main body 221. Accommodation units 208a to 208c for respectively accommodating the rear surface brush 241, the nozzle 251 and the nozzle 261 are respectively provided at the retreat positions. FIG. 4 illustrates a state in which the rear surface cleaning unit 204, the first supply unit 205 and the second supply unit 206 are placed at the corresponding retreat positions, and the rear surface brush 241, the nozzle 251 and the nozzle 261 are respectively accommodated in the accommodation units 208a to 208c.

<Configuration of Delivery Block 4>

Now, the delivery block 4 will be elaborated. As illustrated in FIG. 1 and FIG. 2, the delivery block 4 incorporates therein a plurality of delivery devices 15a and 15b, a first buffer unit 21U, a second buffer unit 21L, a first transit unit 22U, a second transit unit 22L, a first reversing device 23a and a second reversing device 23b.

The first buffer unit 21U, the second buffer unit 21L, the first transit unit 22U, the second transit unit 22L, the first reversing device 23a and the second reversing device 23b are vertically arranged in a height direction. To elaborate, these units are arranged in the order of the first transit unit 22U, the first buffer unit 21U, the second buffer unit 21L, the second transit unit 22L, the first reversing device 23a and the second reversing device 23b in sequence from the top (see FIG. 2).

Further, the number of the buffer units (here, the first buffer unit 21U and the second buffer unit 21L), the transit units (here, the first transit unit 22U and the second transit unit 22L), the reversing devices (here, the first reversing device 23a and the second reversing device 23b) and the arrangement thereof in the height direction are not limited to the shown example. By way of example, within the delivery block 4, a transit unit, a buffer unit, a reversing device, a transit unit and a reversing device may be arranged in this order from the top.

Each of the delivery devices 15a and 15b includes a non-illustrated elevating device. By being moved in the vertical direction through the elevating device, each of the delivery devices 15a and 15b carries a wafer W into and out of the first transit unit 22U or other units, which are vertically arranged in the height direction. The delivery device 15a is configured to access the first transit unit 22U and the like from the positive Y-axis direction of the first transit unit 22U and the like, whereas the delivery device 15b is configured to access the first transit unit 22U and the like from the negative Y-axis direction of the first transit unit 22U and the like.

Each of the first buffer unit 21U, the second buffer unit 21L, the first transit unit 22U and the second transit unit 22L is a module configured to accommodate therein wafers W in multiple levels. Among these units, the first buffer unit 21U and the second buffer unit 21L are accessed by the main transfer device 13 and the delivery devices 15a and 15b.

<Configuration of Control Device>

The substrate processing system 1 includes a control device 5 (see FIG. 1). The control device 5 is, for example, a computer, and includes a controller 51 and a storage unit 52. The storage unit 52 stores therein a program for controlling various kinds of processes performed in the substrate processing system 1. The controller 51 is implemented by, for example, a CPU (Central Processing Unit) and controls an operation of the substrate processing system 1 by reading and executing the program stored in the storage unit 52.

Further, this program may be recorded on a computer-readable recording medium and installed in the storage unit 52 of the control device 5 from the recording medium. The computer-readable recording medium may include, but not limited to, a hard disk (HD), a flexible disk (FD), a compact disk (CD), a magneto-optical disk (MO), and a memory card. Further, the controller 51 may only be composed of hardware without using a program.

<Transfer Flow of Wafer>

Now, an example of a transfer flow of a wafer W in the substrate processing system 1 will be briefly explained. In the substrate processing system 1, the main transfer device 13 takes out a plurality of unprocessed wafers W from a cassette C and carries the plurality of unprocessed wafers W in the first buffer unit 21U. Then, the delivery device 15a takes out an unprocessed wafer W out of the first buffer unit 21U and transports it into the first transit unit 22U. Thereafter, the first transfer device 17 of the first processing block 3U takes out the wafer W from the first transit unit 22U and transfers the wafer W into the first processing unit 18, and the first processing unit 18 performs a bevel cleaning process on the wafer W. Upon the completion of the bevel cleaning process, the first transfer device 17 takes out the wafer W on which the bevel cleaning process is completed, i.e., bevel-cleaned wafer W from the first processing unit 18 and carries it back into the first transit unit 22U.

Subsequently, the delivery device 15a takes out the bevel-cleaned wafer W from the first transit unit 22U and carries it into the first reversing device 23a. The first reversing device 23a reverses front/rear surfaces of the wafer W. Thereafter, the delivery device 15b takes out the wafer W from the first reversing device 23a and carries it into the second transit unit 22L. Afterwards, the second transfer device 27 of the second processing block 3L takes out the wafer W from the second transit unit 22L and transfers it into the second processing unit 28, and the second processing unit 28 performs a rear surface cleaning process on the wafer W. Then, upon the completion of the rear surface cleaning process, the second transfer device 27 takes out the wafer W, on which the rear surface cleaning process is completed, from the second processing unit 28 and carries it into the second transit unit 22L.

Subsequently, the delivery device 15b takes out the wafer W from the second transit unit 22L and carries it into the second reversing device 23b, and the second reversing device 23b reverses the front/rear surfaces of the wafer W. Then, the delivery device 15a takes out the wafer W from the second reversing device 23b and carries it into the second buffer unit 21L. Then, the main transfer device 13 takes out the processed wafers W, on which the bevel cleaning process and the rear surface cleaning process are completed, from the second buffer unit 21L and carries them in the cassette C. Then, the series of substrate processings are finished.

<Configuration of Rear Surface Cleaning Unit>

Figure 6:
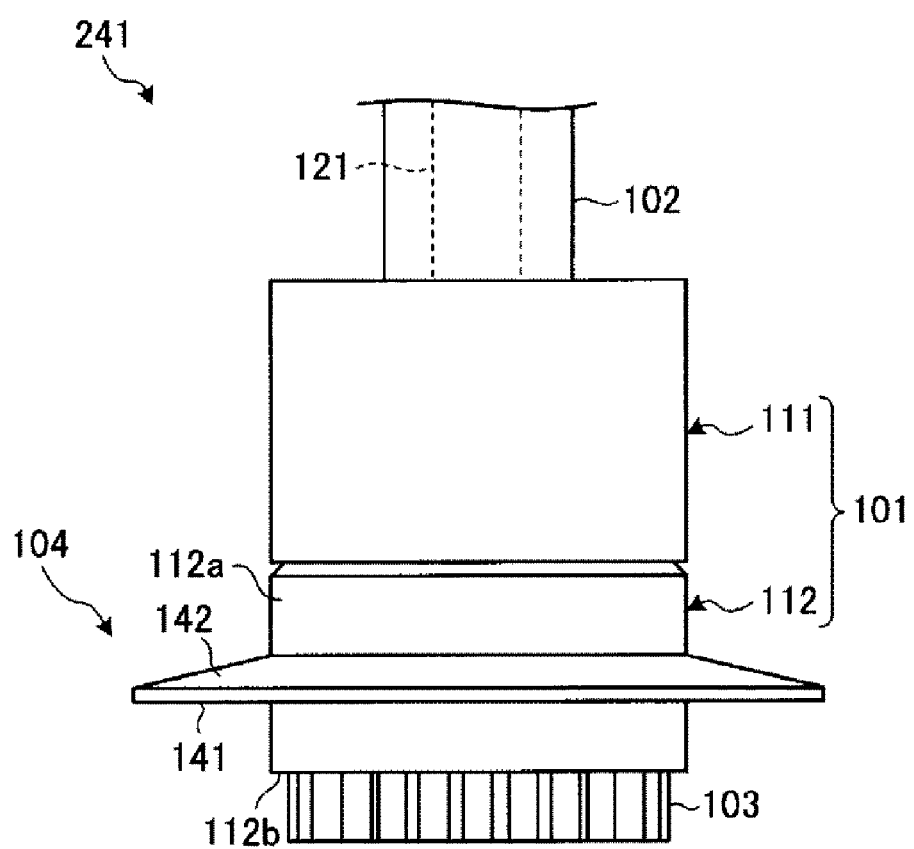
FIG. 6 is a schematic side view of a rear surface brush.
Figure 7:
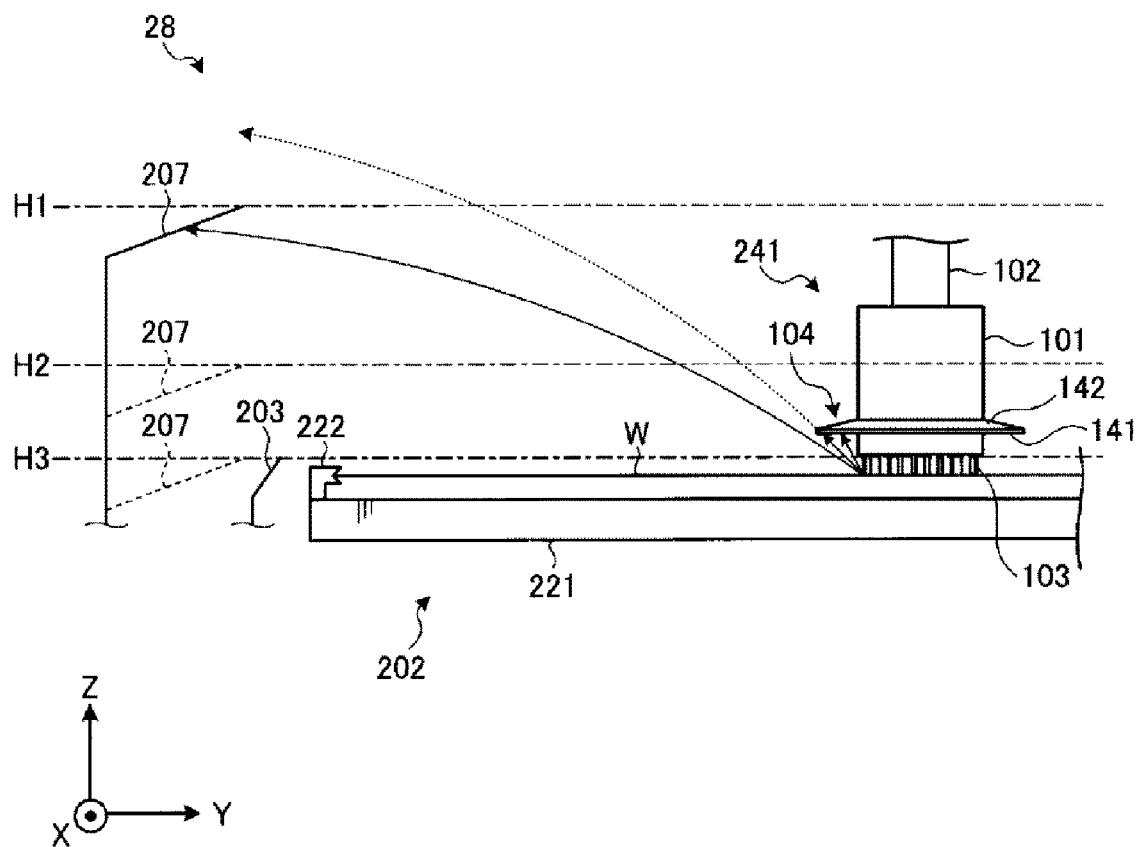
FIG. 7 is a diagram showing a relationship between a liquid receiving member and a surrounding wall.

Now, a detailed configuration of the rear surface cleaning unit 204 will be explained with reference to FIG. 6 to FIG. 11. First, a configuration of the rear surface brush 241 will be explained with reference to FIG. 6 and FIG. 7. FIG. 6 is a schematic side view of the rear surface brush 241. Further, FIG. 7 is a diagram showing a relationship between a liquid receiving member and the surrounding wall 207.

As depicted in FIG. 6, the rear surface brush 241 includes a main body 101, connecting member 102, a cleaning body 103 and a liquid receiving member 104.

The main body 101 has a cylindrical shape and is connected to a spindle 242 via the connecting member 102 (see FIG. 4). The main body 101 includes a first main body portion 111 and a second main body portion 112. The first main body portion 111 and the second main body portion 112 are cylindrical members having a same diameter. The main body 101 is prepared by connecting the second main body portion 112 to a bottom portion of the first main body portion 111.

The connecting member 102 has a cylindrical shape having a diameter smaller than that of the main body 101. The connecting member 102 is provided at the first main body portion 111 and is protruded upward from the first main body portion 111. Further, the connecting member 102 is provided with an insertion hole 121, and the spindle 242 is inserted into this insertion hole 121. By fixing the spindle 242 and the connecting member 102 with a screw or the like, the main body 101 is fixed to the spindle 242.

The cleaning body 103 is provided under the second main body portion 112 and is pressed against the wafer W. The cleaning body 103 may be composed of a large number of hair bundles, but not limited thereto. For example, the cleaning body 103 may be implemented by a sponge or the like.

The liquid receiving member 104 is provided at an outer periphery portion of the main body 101, specifically, at an outer periphery portion 112a of the second main body portion 112. The liquid receiving member 104 has a hood shape protruded from the outer periphery portion 112a of the second main body portion 112 and is capable of receiving a processing liquid dispersed from the cleaning body 103 with a bottom surface 141 thereof. As a result, it is possible to suppress the processing liquid from being scattered over the surrounding wall 207 (see FIG. 7). Since the liquid receiving member 104 has a circular shape when viewed from the top, it is also possible to suppress the scattering of the processing liquid in all directions.

Further, the liquid receiving member 104 is positioned above a mounting surface of the cleaning body 103, that is, a bottom surface 112b of the second main body portion 112, and the bottom surface 141 of the liquid receiving member 104 is located above the bottom surface 112b of the second main body portion 112. By being located at this position, the liquid receiving member 104 can be suppressed from interfering with another member when the rear surface brush 241 is moved toward an outer peripheral portion of the wafer W in a rear surface cleaning process.

To elaborate, as shown in FIG. 7, the bottom surface 141 of the liquid receiving member 104 is located at a position above upper ends of the grippers 222 of the substrate holding unit 202. Further, the bottom surface 141 of the liquid receiving member 104 is located above an upper end of the recovery cup 203. With this configuration, the liquid receiving member 104 can be suppressed from interfering with the grippers 222 and the recovery cup 203. Further, the bottom surface 141 of the liquid receiving member 104 is located at a height where the bottom surface 141 does not come into contact with the grippers 222 (see FIG. 5), and may be inclined downwards or horizontal with respect to a direction in which the bottom surface 141 is protruded from the outer periphery portion 112a of the second main body portion 112. If the bottom surface 141 of the liquid receiving member 104 is inclined downwards, stay of the liquid on the bottom surface 141 of the liquid receiving member 104 can be further suppressed. Furthermore, by allowing the bottom surface 141 of the liquid receiving member 104 to be hydrophobic, the liquid can be suppressed from remaining on the bottom surface 141 of the liquid receiving member 104. Moreover, by allowing the outer periphery portion of the main body 101 to be hydrophobic, the liquid can be suppressed from remaining on the outer periphery portion of the main body 101.

When a process in which the rear surface brush 241 is used is performed during the rear surface cleaning process, the surrounding wall 207 is located at a first height position H1 where an upper end of the surrounding wall 207 is positioned highest. The liquid receiving member 104 has a diameter capable of suppressing the processing liquid scattered from the cleaning body 103 from going over the surrounding wall 207 which is located at the first height position H1. This diameter is determined based on at least a relationship between an angle of the processing liquid scattered from the cleaning body 103 with respect to the wafer W and the first height position H1 of the surrounding wall 207, as shown in FIG. 7. Further, a speed of the scattered processing liquid and a position of the cleaning body 103 on the wafer W may also be involved in the decision of the diameter. As stated, the liquid receiving member 104 can receive the processing liquid scattered over the surrounding wall 207 while the surrounding wall 207 can suppress the scattering of the processing liquid to some extent. Accordingly, it is possible to suppress scattering of the processing liquid while allowing the height of the surrounding wall 207 to be low.

Furthermore, the hood-shaped top surface 142 of the liquid receiving member 104 is downwardly inclined in the outward direction. Thus, it is possible to suppress the processing liquid from remaining on the top surface 142. In addition, the shape of the top surface 142 need not have a constant inclination angle in the outward direction as shown in FIG. 6. For example, the top surface 142 may have a multi-step inclined shape with the inclination angles increased step by step in the outward direction or an arc shape with the inclination angles increased gradually in the outward direction.

In the series of substrate processes, the height position of the surrounding wall 207 is switched between the first height position H1, a second height position H2 and a third height position H3. The first height position H1 is the height position where the surrounding wall 207 is located when a process with the rear surface brush 241 is performed during the rear surface cleaning process. The second height position H2 is a height position where the surrounding wall 207 is located when a process (for example, a process with only the second supply unit 206) involving less scattering of the processing liquid as compared to the process with the rear surface brush 241 is performed. The second height position H2 is set to be lower than the first height position H1. The third height position H3 is an initial position of the surrounding wall 207, and is set to be lower than the second height position H2 and equal to the height position of, for example, the recovery cup 203.

Further, the third height position H3 is a height position which interferes with the rear surface cleaning unit 204, the first supply unit 205 and the second supply unit 206, whereas the first height position H1 and the second height position H2 are height positions which do not interfere with the rear surface cleaning unit 204, the first supply unit 205 and the second supply unit 206.

Figure 8:
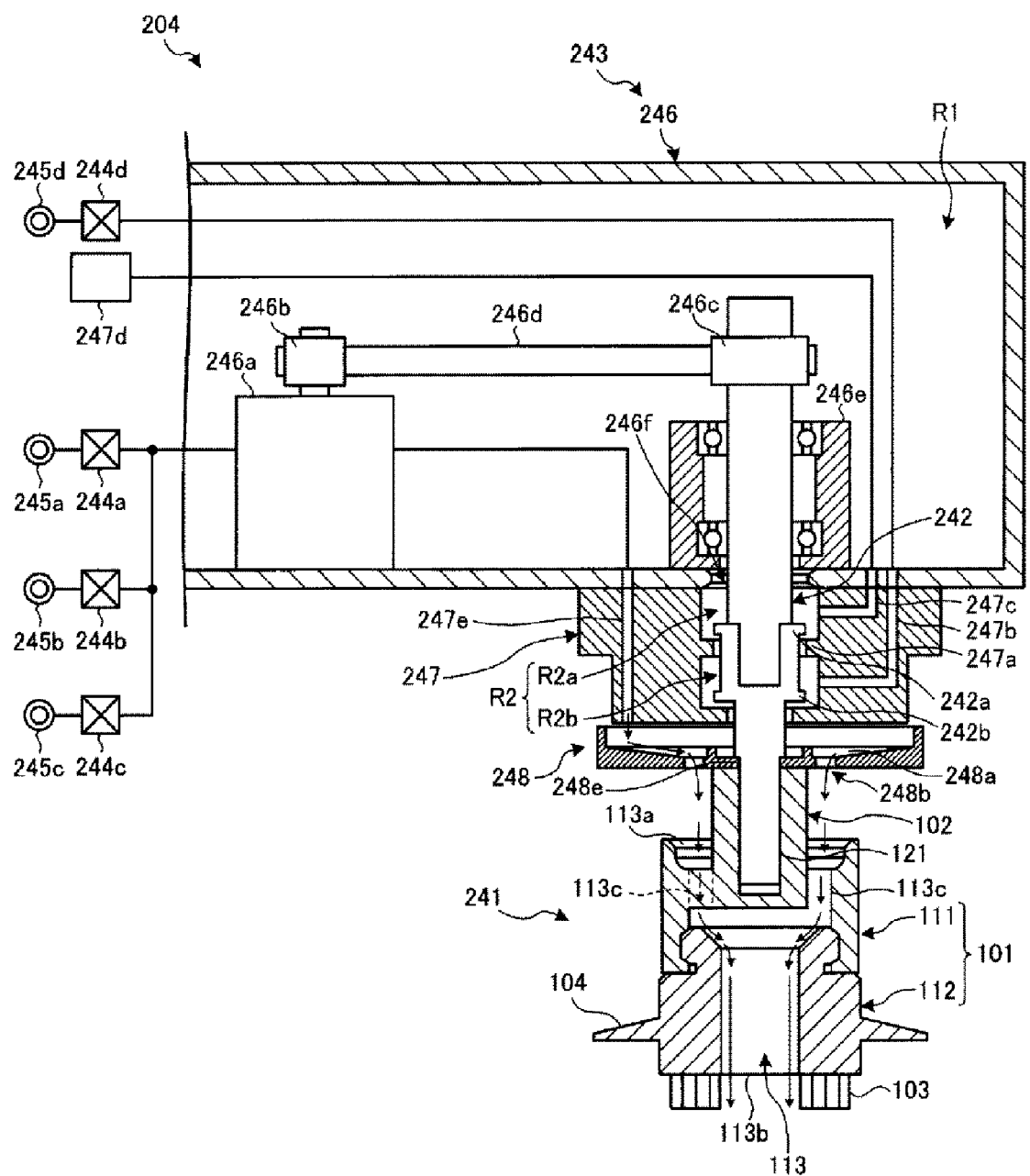
FIG. 8 is a schematic side cross sectional view of the rear surface cleaning unit.

FIG. 8 is a schematic side view of the rear surface cleaning unit 204. As depicted in FIG. 8, the arm 243 includes a first arm body 246 extended in the horizontal direction; and a second arm body 247 provided at a lower portion of the first arm body 246.

The first arm body 246 has a driving unit 246a such as a motor configured to rotate the spindle 242 and a first inner space R1 for accommodating therein a part of the spindle 242. The driving unit 246a and the spindle 242 are connected to each other by, for example, pulleys 246b and 246c and a transmission belt 246d. Besides, a bearing 246e configured to support the spindle 242 rotatably, a non-illustrated device such as a load cell, and the like are also arranged in the first inner space R1.

An insertion through hole 246f through which the spindle 242 is inserted is formed at the lower portion of the first arm body 246. Accordingly, the first inner space R1 is not completely sealed.

The second arm body 247 has a second inner space R2 which allows the first inner space R1 and the outside to communicate with each other through the insertion through hole 246f of the first arm body 246 and covers a part of the spindle 242 which is exposed from the first inner space R1 through the insertion through hole 246f.

The second inner space R2 includes an upper inner space R2a communicating with the insertion through hole 246f of the first arm body 246; and a lower inner space R2b communicating with the upper inner space R2a at an upper portion thereof and communicating with the outside at a lower portion thereof. The upper inner space R2a and the lower inner space R2b are gently partitioned by an annular first protruding portion 247a which is protruded toward the second inner space R2 from an inner peripheral surface of the second arm body 247 which forms the second inner space R2.

The spindle 242 has annular second protruding portions 242a and 242b at a portion thereof positioned within the second inner space R2. The second protruding portions 242a and 242b are protruded outwards from an outer peripheral surface of the spindle 242 in the diametrical direction. The second protruding portion 242a is positioned above the first protruding portion 247a. Further, the second protruding portion 242b is positioned under the first protruding portion 247a.

As stated above, in the rear surface cleaning unit 204, a so-called labyrinth structure is formed within the second inner space R2 by the first protruding portion 247a provided in the second inner space R2 of the second arm body 247 and the second protruding portions 242a and 242b provided at the spindle 242. With this structure, the rear surface cleaning unit 204 is capable of suppressing an atmosphere of, e.g., a first chemical liquid or a second chemical liquid from entering the first inner space R1, so that the driving unit 246a or the like within the first inner space R1 can be suppressed from being deteriorated.

Further, the arm 243 is equipped with a gas supply portion 247b. The gas supply portion 247b is implemented by a passage hole and a pipeline formed in the first arm body 246 or the second arm body 247. One end of the gas supply portion 247b is connected to the lower inner space R2b of the second inner space R2, and the other end thereof is connected to a gas supply source 245d via a valve 244d and a flow rate controller (not shown). This gas supply portion 247b supplies an inert gas such as a $N_2$ gas supplied from the gas supply source 245d into the lower inner space R2b by opening the valve 244d. Accordingly, introduction of an external atmosphere into the lower inner space R2b is impeded by the inert gas, so that the atmosphere of the first chemical liquid or the second chemical liquid can be more securely suppressed from entering the first inner space R1.

Further, the arm 243 has a suction portion 247c. The suction portion 247c is implemented by a passage hole or a pipeline formed in the first arm body 246 and the second arm body 247. One end of the suction portion 247c is connected to the upper inner space R2a of the second inner space R2, and the other end thereof is connected to a suction device 247d. The suction portion 247c sucks an atmosphere within the upper inner space R2a by using the suction device 247d. Accordingly, it is possible to suppress dust generated from the bearing 246e and the driving unit 246a accommodated in the first inner space R1 from being discharged out, so that contamination of the wafer W or the like can be suppressed.

Furthermore, the arm 243 also has a discharge portion 247e. The discharge portion 247e is implemented by a passage hole or a pipeline formed in the first arm body 246 and the second arm body 247. One end of the discharge portion 247e is exposed to a bottom surface of the second arm body 247. The other end of the discharge portion 247e is connected to the first chemical liquid supply source 245a via the valve 244a and the flow rate controller (not shown), the second chemical liquid supply source 245b via the valve 244b and the flow rate controller (not shown) and a rinse liquid supply source 245c via the valve 244c and the flow rate controller (not shown).

This discharge portion 247e discharges the first chemical liquid supplied from the first chemical liquid supply source 245a, the second chemical liquid supplied from the second chemical liquid supply source 245b or the pure water supplied from the rinse liquid supply source 245c downwardly in the vertical direction from the bottom surface of the second arm body 247 in order to supply the first chemical liquid, the second chemical liquid or the pure water to a hollow portion 113 formed in the main body 101 of the rear surface brush 241.

Here, sine the second inner space R2 is formed in the second arm body 247 as stated above, it is difficult to provide the discharge portion 247e at a center side of the second arm body 247. For this reason, the discharge portion 247e is provided at a position distanced away from the spindle 242 farther than the hollow portion 113 of the rear surface brush 241 is distanced away from the spindle 242. To elaborate, the discharge portion 247e is formed at a position distanced away from the spindle 242 farther than an outer periphery portion of the main body 101 of the rear surface brush 241 is distanced away from the spindle 242. In this case, just by discharging the processing liquid from the discharge portion 247e, the processing liquid cannot be supplied to the hollow portion 113.

For this reason, the rear surface cleaning unit 204 is equipped with a guide member 248. The guide member 248 is provided between the discharge portion 247e and the rear surface brush 241, and is configured to receive the processing liquid discharged from the discharge portion 247e and guide the received processing liquid into the hollow portion 113 of the rear surface brush 241.

To elaborate, when viewed from the top, the guide member 248 has a circular plate shape, and is disposed under the second arm body 247 while being spaced apart from the second arm body 247. Further, the guide member 248 has an insertion through hole 248e at a central portion thereof. The spindle 242 is inserted through this insertion through hole 248e. As is held by a step-shaped portion formed at the spindle 242 and the connecting member 102 of the rear surface brush 141 from the up-and-down direction, the guide member 248 is fixed to be rotated along with the spindle 242.

Figure 9:
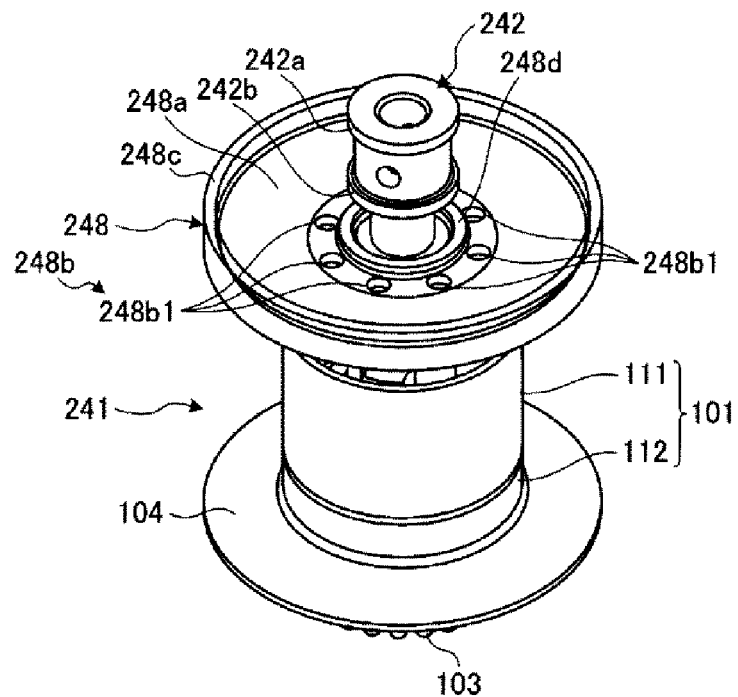
FIG. 9 is a schematic perspective view of a guide member.

Here, a configuration of the guide member 248 will be explained in detail with reference to FIG. 9. FIG. 9 is a schematic perspective view of the guide member 248.

As depicted in FIG. 9, the guide member 248 has a receiving surface 248a and a drain portion 248b. The receiving surface 248a is an inclined surface which is positioned under the discharge portion 247e and downwardly inclined toward the spindle 242 from a position distanced away from the spindle 242 farther than the discharge portion 247e is distanced away from the spindle 242.

The drain portion 248b is provided at a region of the receiving surface 248a located directly above the hollow portion 113 of the rear surface brush 241. The drain portion 248b drains the processing liquid received by the receiving surface 248a toward the hollow portion 113. To elaborate, the drain portion 248b includes a multiple number of drain openings 248b1 arranged in a circumferential direction with respect to the receiving surface 248a. As compared to a case where a single drain opening is provided, the processing liquid received by the receiving surface 248a can be uniformly dropped into the hollow portion 113.

Further, the guide member 248 is provided with a first surrounding wall portion 248c which is arranged to stand upright from an outer peripheral portion of the receiving surface 248a. This first surrounding wall portion 248c suppresses the processing liquid received by the receiving surface 248a from being dropped off the outer peripheral portion of the receiving surface 248a. Further, the guide member 248 also includes a second surrounding wall portion 248d which is arranged to stand upright between the drain portion 248b and the spindle 242. This second surrounding wall portion 248d suppresses the processing liquid received by the receiving surface 248a from entering the insertion hole 121 of the connecting member 102 along the spindle 242. Further, the deterioration of the spindle 242 and the connecting member 102 due to the processing liquid can be suppressed.

Figure 10:
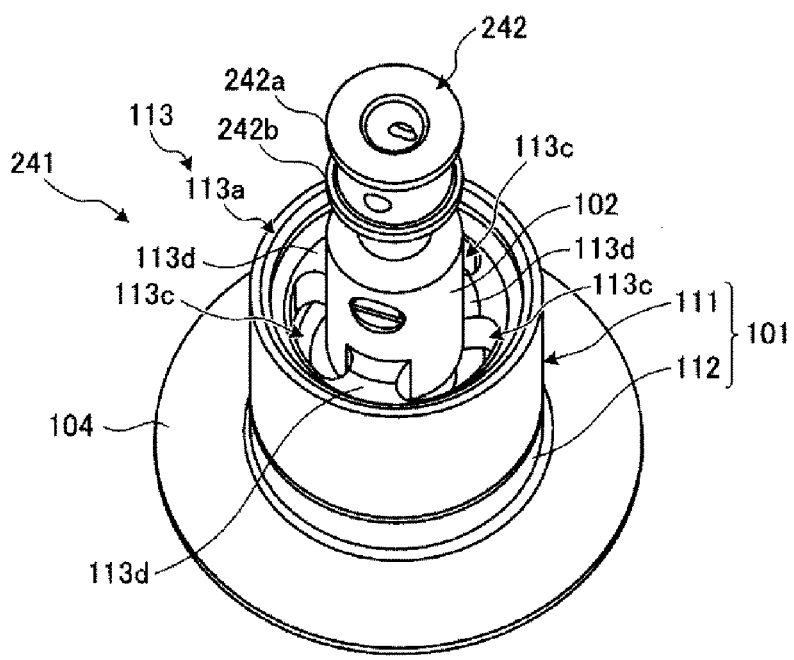
FIG. 10 is a schematic perspective view of the rear surface brush.

Now, a configuration of the hollow portion 113 of the rear surface brush 241 will be explained with reference to FIG. 8 and FIG. 10. FIG. 10 is a schematic perspective view of the rear surface brush 241.

As depicted in FIG. 8, the main body 101 of the rear surface brush 241 has the hollow portion 113 having an open top and an open bottom. The top opening 113a of the hollow portion 113 is provided at the first main body portion 111. An inner surface of the top opening 113a is provided at a position distanced away from the spindle 242 farther than the discharge portion 248b of the guide member 248 is distanced away from the spindle 242.

The bottom opening 113b of the hollow portion 113 is provided at the second main body portion 112. The bottom opening 113b has a diameter smaller than that of the top opening 113a. To elaborate, an inner surface of the bottom opening 113b is provided at a position closer to the spindle 242 than the drain portion 248b of the guide member 248. Thus, after the processing liquid drained from the drain portion 248b of the guide member 248 enters the hollow portion 113 through the top opening 113a, the processing liquid is collected toward the spindle 242 and discharged toward the wafer W through the bottom opening 113b.

As shown in FIG. 10, a multiple number of openings 113c is provided at a midway portion of the hollow portion 113. The openings 113c are provided at the first main body portion 111. Further, connecting portions 113d connecting the first main body portion 111 and the connecting member 102 are provided between the respective openings 113c.

<Configuration of Accommodation Unit for Rear Surface Brush>

Figure 11:
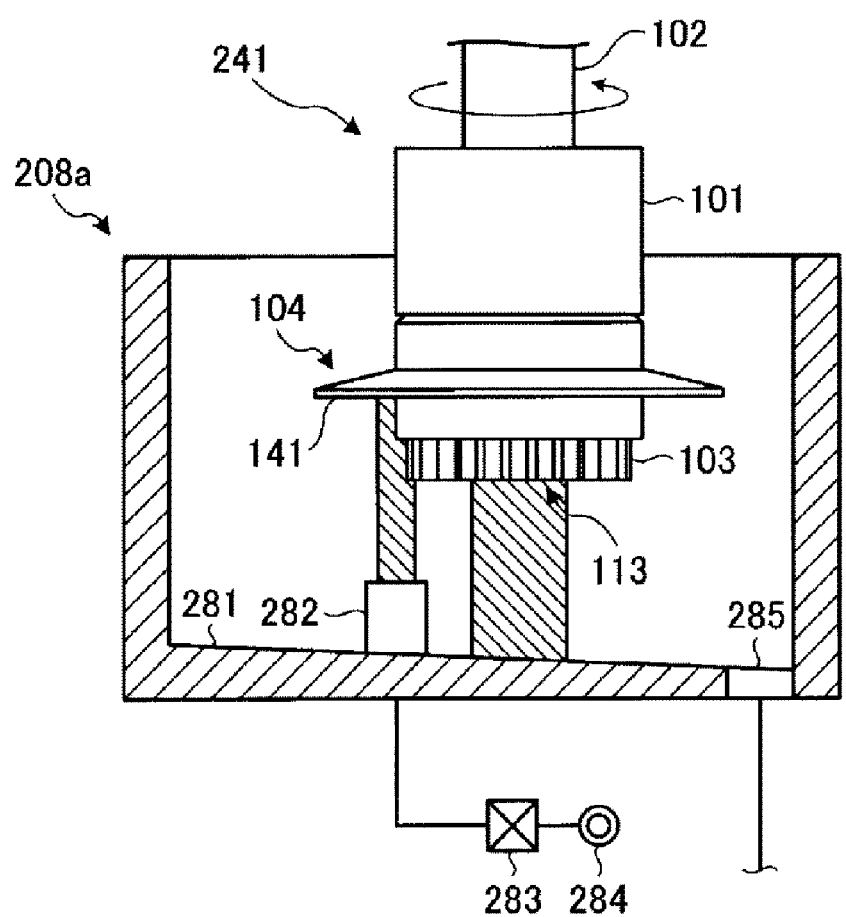
FIG. 11 is a schematic side view of an accommodation unit.

Now, the accommodation unit 208a for the rear surface brush 241 will be explained with reference to FIG. 11. FIG. 11 is a schematic side view of the accommodation unit 208a.

As illustrated in FIG. 11, on a bottom surface 281 of the accommodation unit 208a which is the retreat position of the rear surface brush 241, there is provided a brush cleaning unit 282 configured to clean the rear surface brush 241 which is located at the retreat position. The brush cleaning unit 282 is equipped with a discharge opening through which a cleaning liquid is discharged vertically upwards, and is connected to a cleaning liquid supply source 284 via a valve 283, a flow rate controller (not shown), and the like. This brush cleaning unit 282 cleans the rear surface brush 241 with the cleaning liquid (here, pure water) supplied from the cleaning liquid supply source 284 by discharging the cleaning liquid vertically upwards toward the rear surface brush 241 from the discharge opening on the bottom surface 281 of the accommodation unit 208a.

The discharge opening of the brush cleaning unit 282 is provided vertically downwards below a region including an outer periphery portion of the cleaning body 103 located at the retreat position and a base end portion of the liquid receiving member 104. The pure water as the cleaning liquid is supplied to this region through the discharge opening. Accordingly, the liquid receiving member 104 as well as the cleaning body 103 can also be cleaned.

Further, in this brush cleaning process, the rear surface cleaning unit 204 discharges pure water from the hollow portion 113 of the rear surface brush 241. Accordingly, the inside of the cleaning body 103 as well as the outside thereof can be cleaned.

Furthermore, on the bottom surface 281 of the accommodation unit 208a, there is also provided a drain portion 285 through which the pure water discharged from the brush cleaning unit 282 and the hollow portion 113 in the brush cleaning process is drained out. The bottom surface 281 of the accommodation unit 208a is downwardly inclined toward the drain portion 285.

<Process Sequence of Rear Surface Cleaning Process>

Figure 12:
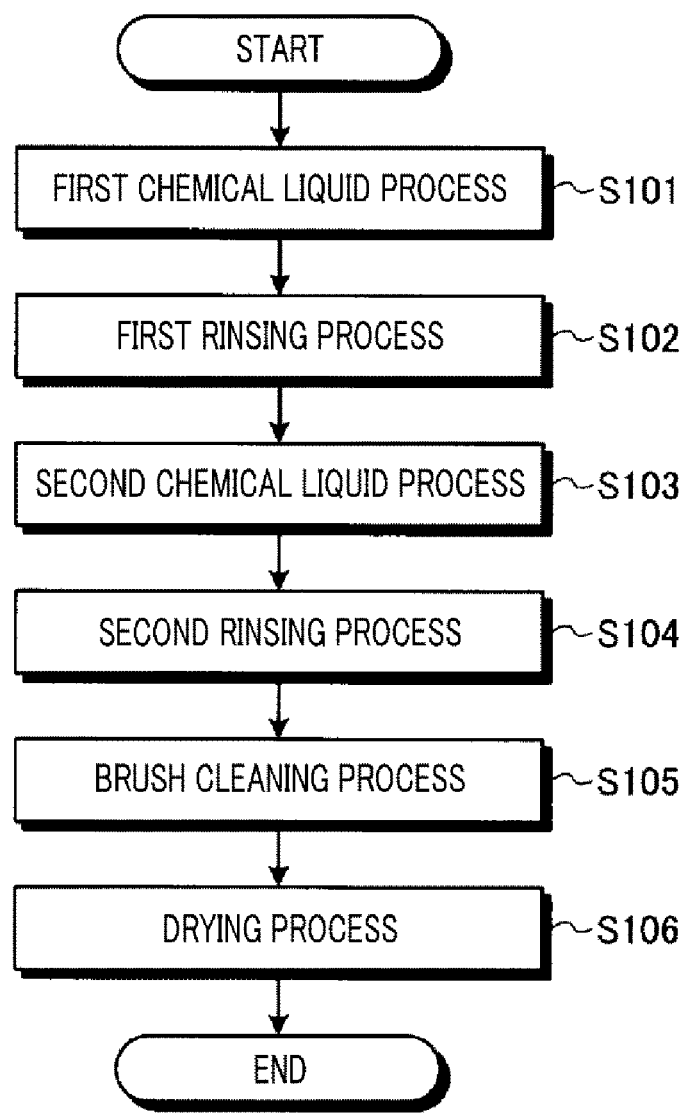
FIG. 12 is a flowchart for describing a process sequence of a rear surface cleaning process.

Now, a detailed process sequence of the rear surface cleaning process performed in the second processing unit 28 will be described with reference to FIG. 12. FIG. 12 is a flowchart for describing the process sequence of the rear surface cleaning process. Each process shown in FIG. 12 is performed as the controller 51 controls the substrate holding unit 202, the rear surface cleaning unit 204, the first supply unit 205 and the second supply unit 206 of the second processing unit 28.

As depicted in FIG. 12, in the second processing unit 28, after a wafer W carried into the chamber 201 is held by the substrate holding unit 202, a first chemical liquid process is performed (step S101). In the first chemical liquid process, the nozzle 251 is located above the wafer W by rotating the nozzle arm 252 with the rotating/elevating device 253 of the first supply unit 205. Then, the rear surface brush 241 is located above the wafer W by rotating the arm 243 with the rotating/elevating device 244 of the rear surface cleaning unit 204. Thereafter, the surrounding wall 207 is moved up by using the elevating device 271 such that the height position of the surrounding wall 207 is changed to the first height position H1 from the third height position H3 (see FIG. 7).

Subsequently, the wafer W is rotated by using the driving unit 224 of the substrate holding unit 202, and the rear surface brush 241 is rotated by using the driving unit 246a of the rear surface cleaning unit 204. Further, SC-1 as a first chemical liquid is supplied to the wafer W from the nozzle 251 of the first supply unit 205, and SC-1 is also supplied to the wafer W from the hollow portion 113 of the rear surface brush 241. Then, the rear surface brush 241 is lowered by using the rotating/elevating device 244 of the rear surface cleaning unit 204, so that the cleaning body 103 is pressed onto the wafer W. Then, the rear surface brush 241 and the nozzle 251 are moved from a central portion of the wafer W toward an outer periphery portion thereof. As a result, a particle is removed from the wafer W by the physical cleaning with the cleaning body 103 and the chemical cleaning with the SC-1.

If the rear surface brush 241 reaches the outer periphery portion of the wafer W, the supplies of the SC-1 from the nozzle 251 and the hollow portion 113 are stopped, and the rear surface brush 241 is moved up, and then, the rotation thereof is stopped. Further, the rear surface brush 241 and the nozzle 251 is moved to the central portion of the wafer W.

Afterwards, in the second processing unit 28, a first rinsing process is performed (step S102). In the first rinsing process, the processing liquid discharged to the wafer W is changed from the first chemical liquid to pure water as a rinse liquid, and the rear surface cleaning unit 204 and the first supply unit 205 are operated in the same way as in the above-described first chemical liquid process. Accordingly, the SC-1 on the wafer W is washed away by the pure water.

If the rear surface brush 241 reaches the outer periphery portion of the wafer W, the supplies of the pure water from the nozzle 251 and the hollow portion 113 are stopped, and the rear surface brush 241 is moved up and then the rotation thereof is stopped. Then, the surrounding wall 207 is moved to the second height position H2 from the first height position H1, and then, the rear surface brush 241 and the first supply unit 205 are retreated from above the wafer W.

Subsequently, in the second processing unit 28, a second chemical liquid process is performed (step S103). In the second chemical liquid process, the nozzle 261 of the second supply unit 206 is located above the wafer W. Then, the rear surface brush 241 is located above the wafer W, and the surrounding wall 207 is moved from the second height position H2 to the first height position H1.

Thereafter, the rear surface brush 241 is rotated, and DHF as a second chemical liquid is supplied onto the wafer W from the nozzle 261 of the second supply unit 206, and DHF is supplied to the wafer W from the hollow portion 113 of the rear surface brush 241 as well. Then, after pressing the cleaning body 103 onto the wafer W by lowering the rear surface brush 241, the rear surface brush 241 and the nozzle 261 are moved from the central portion of the wafer W toward the outer periphery portion thereof. As a result, a particle is removed from the wafer W by the physical cleaning with the cleaning body 103 and the chemical cleaning with the DHF.

If the rear surface brush 241 reaches the outer periphery portion of the wafer W, the supplies of the DHF from the nozzle 261 and the hollow portion 113 are stopped, and the rear surface brush 241 is moved up and then the rotation thereof is stopped. Then, the surrounding wall 207 is moved from the first height position H1 to the second height position H2, and then, the rear surface brush 241 is retreated from above the wafer W.

Afterwards, in the second processing unit 28, a second rinsing process is performed (step S104). In the second rinsing process, pure water as a rinse liquid is supplied onto the wafer W from the nozzle 261 of the second supply unit 206. As a result, the DHF on the wafer W is washed away by the pure water. Thereafter, the supply of the pure water from the nozzle 261 is stopped, and then, the second supply unit 206 is retreated from above the wafer W.

Subsequently, in the second processing unit 28, the brush cleaning process is performed (step S105). In the brush cleaning process, the rear surface brush 241 is rotated within the accommodation unit 208a as the retreat position, and pure water is supplied from the bottom surface 281 to the region including the outer periphery portion of the cleaning body 103 and the base end portion of the liquid receiving member 104. Further, pure water is also discharged from the hollow portion 113 of the rear surface brush 241 which is being rotated. As a result, both the inside and the outside of the cleaning body 103 are cleaned, and the liquid receiving member 104 is also cleaned.

Then, in the second processing unit 28, a drying process is performed (step S106). In the drying process, the wafer W is rotated at a rotational speed higher than that in the second rinsing process. Accordingly, the pure water on the wafer W is removed so that the wafer W is dried. Thereafter, the rotation of the wafer W is stopped, and the surrounding wall 207 is moved from the second height position H2 to the third height position H3.

Further, the brush cleaning process may be performed in parallel with the second rinsing process or the drying process. Further, the brush cleaning process may be performed in parallel with a carry-out process of a processed wafer W or a carry-in process of an unprocessed wafer W.

As stated above, in the rear surface cleaning unit 204, since the processing liquid is discharged from the inside of the rear surface brush 241 as well as from the outside thereof in the first chemical liquid process, the first rinsing process and the second chemical liquid process, the particle or the like removed from the wafer W can be suppressed from remaining inside the cleaning body 103.

Furthermore, from the discharge portion 247e (see FIG. 8) of the rear surface cleaning unit 204, among the plural kinds of processing liquids, the first chemical liquid as a first processing liquid is discharged by opening the valve 244a and then the valve 244a is closed; the pure water as a second processing liquid is continuously discharged by opening the valve 244c and then the valve 244c is closed; and then, the second chemical liquid as a third processing liquid is discharged by opening the valve 244b. As stated, in the first rinsing process after the first chemical liquid process and before the second chemical liquid process, by discharging the pure water from the hollow portion 113 of the rear surface brush 241, that is, from the inside of the cleaning body 103, it is possible to remove the SC-1 from the cleaning body 103 more securely. Therefore, the generation of the salt caused by the reaction between the DHF and the SC-1 can be avoided in the second chemical liquid process.

Meanwhile, the second processing unit 28 performs an initializing process of returning the rear surface cleaning unit 204, the first supply unit 205 and the second supply unit 206 to their retreat positions as initial positions thereof after power is on, for example. In the initializing process, the second processing unit 28 concurrently rotates the arm 243 of the rear surface cleaning unit 204, the nozzle arm 252 of the first supply unit 205 and the nozzle arm 262 of the second supply unit 206 toward the retreat positions at the same speed.

The arm 243 of the rear surface cleaning unit 204 rotates the rear surface brush 241 along a path intersecting with a rotation path of the nozzle arm 252 of the first supply unit 205 and a rotation path of the nozzle arm 262 of the second supply unit 206. However, if the arm 243 and the nozzle arms 252 and 262 are configured to be concurrently moved at the same speed, they can be returned back to their retreat positions as the initial positions without interfering with each other even if the arm 243 or the like is deviated from a normal position because an operator manually moves the arm 243 when power is off, for example.

As stated above, the second processing unit 28 (an example of a substrate cleaning apparatus) according to the exemplary embodiment is equipped with the substrate holding unit 202, the rear surface brush 241 (an example of a brush), the arm 243, the first supply unit 205 and the second supply unit 206 (an example of a supply unit). The substrate holding unit 202 rotatably holds the wafer W (an example of a substrate). The arm 243 rotatably supports the rear surface brush 241 with the spindle 242 therebetween. The first supply unit 205 and the second supply unit 206 supply the processing liquid to the wafer W. Further, the rear surface brush 241 includes the main body 101, the cleaning body 103 and the liquid receiving member 104. The main body 101 is connected to the spindle 242. The cleaning body 103 is provided at the lower portion of the main body 101 and is pressed against the wafer W. The liquid receiving member 104 is provided at the outer periphery portion of the main body 101 and receives the processing liquid scattered from the cleaning body 103.

With this configuration, the second processing unit 28 according to the exemplary embodiment is capable of suppressing the scattering of the processing liquid.

Furthermore, the second processing unit 28 (the example of the substrate cleaning apparatus) according to the exemplary embodiment is equipped with the substrate holding unit 202, the rear surface brush 241 (the example of the brush), the arm 243, the discharge portion 247e and the guide member 248. The substrate holding unit 202 rotatably holds the wafer W (the example of the substrate). The rear surface brush 241 is the hollow-shaped brush having the open top and the open bottom. The arm 243 rotatably supports the rear surface brush 241 with the spindle 242 therebetween. The discharge portion 247e is formed at the arm 243 and is capable of selectively discharging plural kinds of the processing liquids. The guide member 248 is provided between the discharge portion 247e and the rear surface brush 241, and receives the processing liquids discharged from the discharge portion 247e and guides the received processing liquids into the hollow portion 113 of the brush.

Thus, according to the second processing unit 28 of the present exemplary embodiment, even in case of supplying plural kinds of the cleaning liquids to the rear surface brush 241, the cleaning process can be performed effectively. Further, the particle or the like removed from the wafer W can be suppressed from remaining in the cleaning body 103 of the rear surface cleaning unit 204.

In the above-described first exemplary embodiment, the guide member 248 is configured to be rotated as one body with the rear surface brush 241. However, the guide member 248 may be rotated as a separate body from the second arm body 247.

Further, in the above first exemplary embodiment, there has been described an example where the liquid receiving member 104 is provided at the second main body portion 112 of the main body 101. However, the liquid receiving member 104 may be provided at the first main body portion 111.

In addition, in the above first exemplary embodiment, there has been described the rear surface brush configured to clean the rear surface of the substrate, the exemplary embodiment is not limited thereto. For example, the same configuration may be applied to a brush configured to clean a front surface or a peripheral portion of the substrate.

Moreover, in the above-described first exemplary embodiment, the atmosphere within the upper inner space R2a is sucked while supplying the inert gas into the lower inner space R2b of the second inner space R2 (see FIG. 8). However, it may be also possible to suck the atmosphere within the lower inner space R2b while supplying the inert gas into the upper inner space R2a. Further, the rear surface cleaning unit 204 may not necessarily be equipped with the suction portion 247c.

Furthermore, in the above-described first exemplary embodiment, both the first supply unit 205 and the second supply unit 206 are configured to supply the pure water as the rinse liquid. However, only one of the first supply unit 205 and the second supply unit 206 may be configured to supply the pure water as the rinse liquid. Further, the rear surface cleaning unit 204 may be additionally equipped with a third supply unit configured to supply a rinse liquid.

Second Exemplary Embodiment

Figure 13:
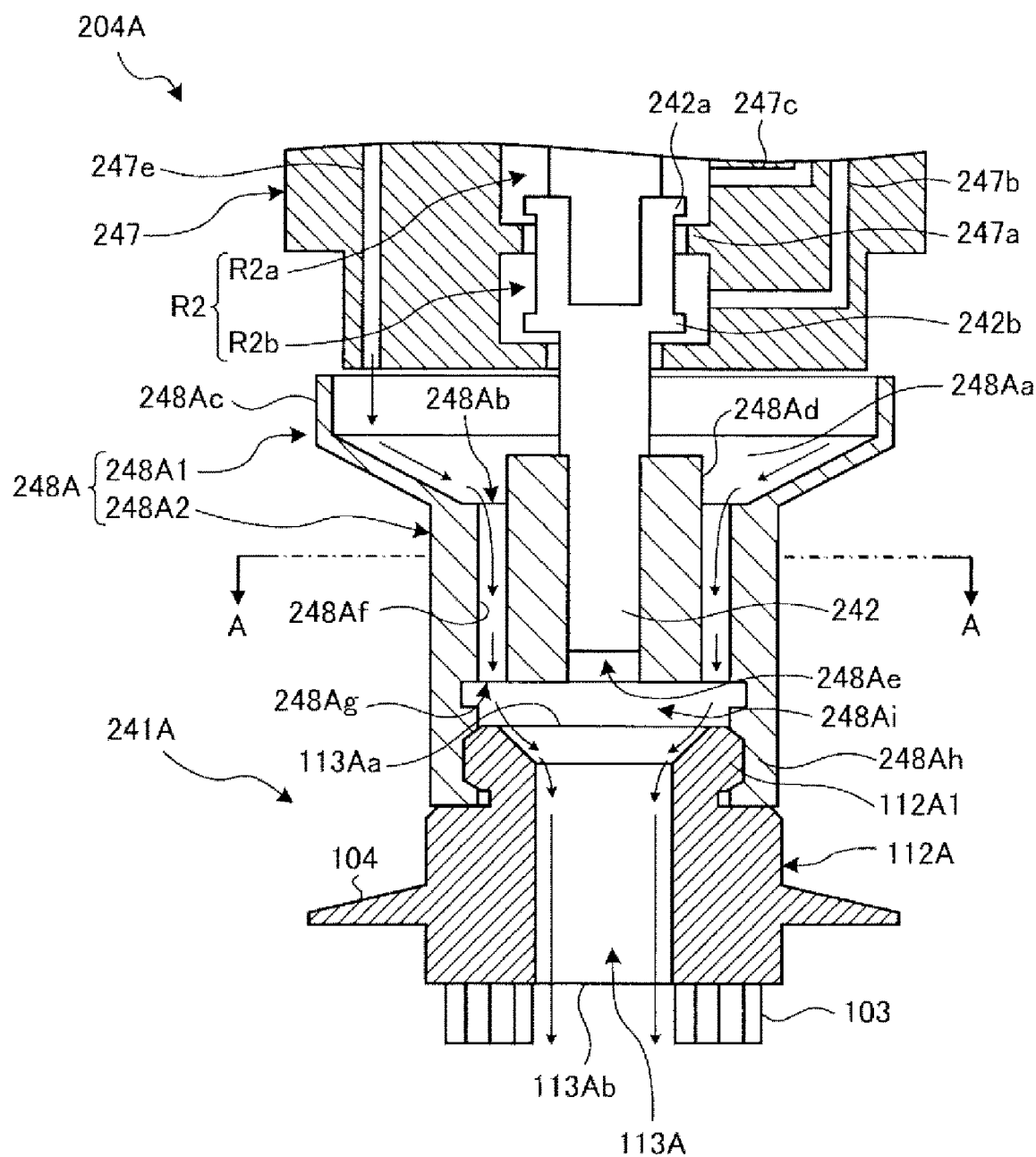
FIG. 13 is a schematic side view illustrating a rear surface cleaning unit according to a second exemplary embodiment.
Figure 14:
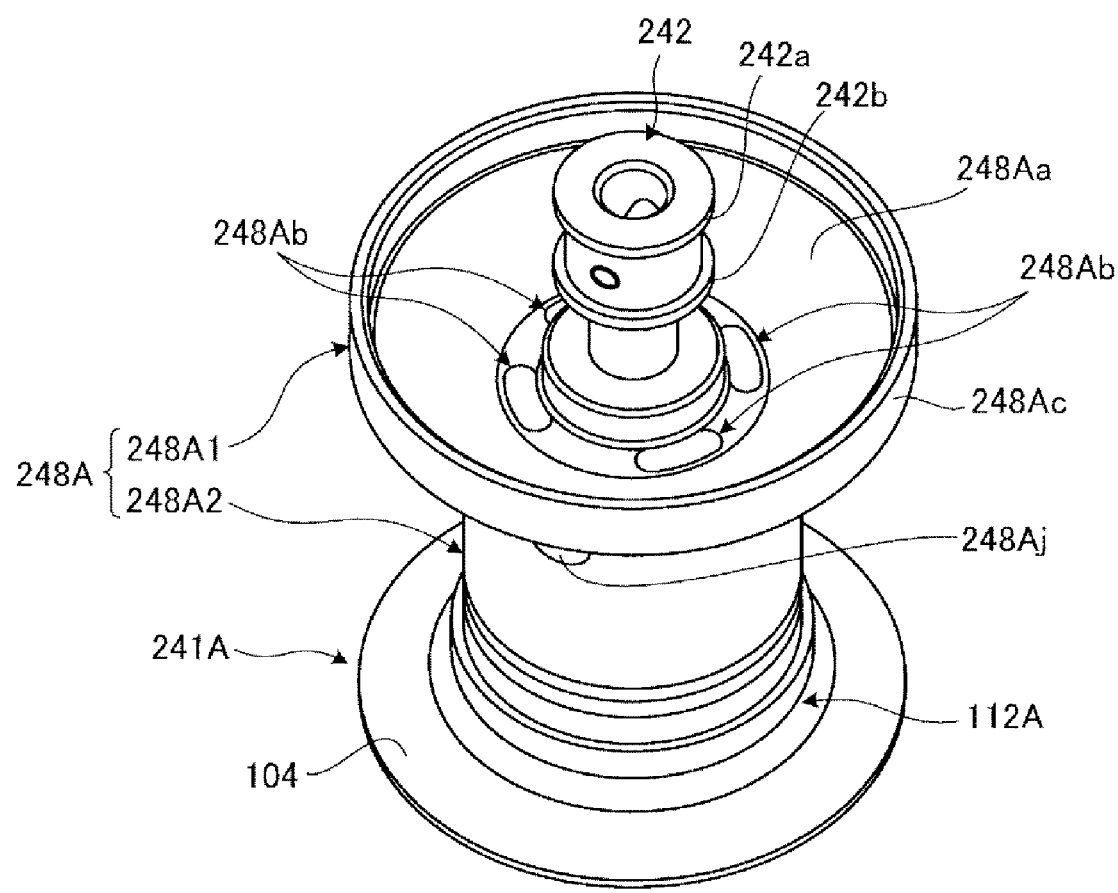
FIG. 14 is a schematic perspective view illustrating a guide member and a rear surface brush according to the second exemplary embodiment.
Figure 15:
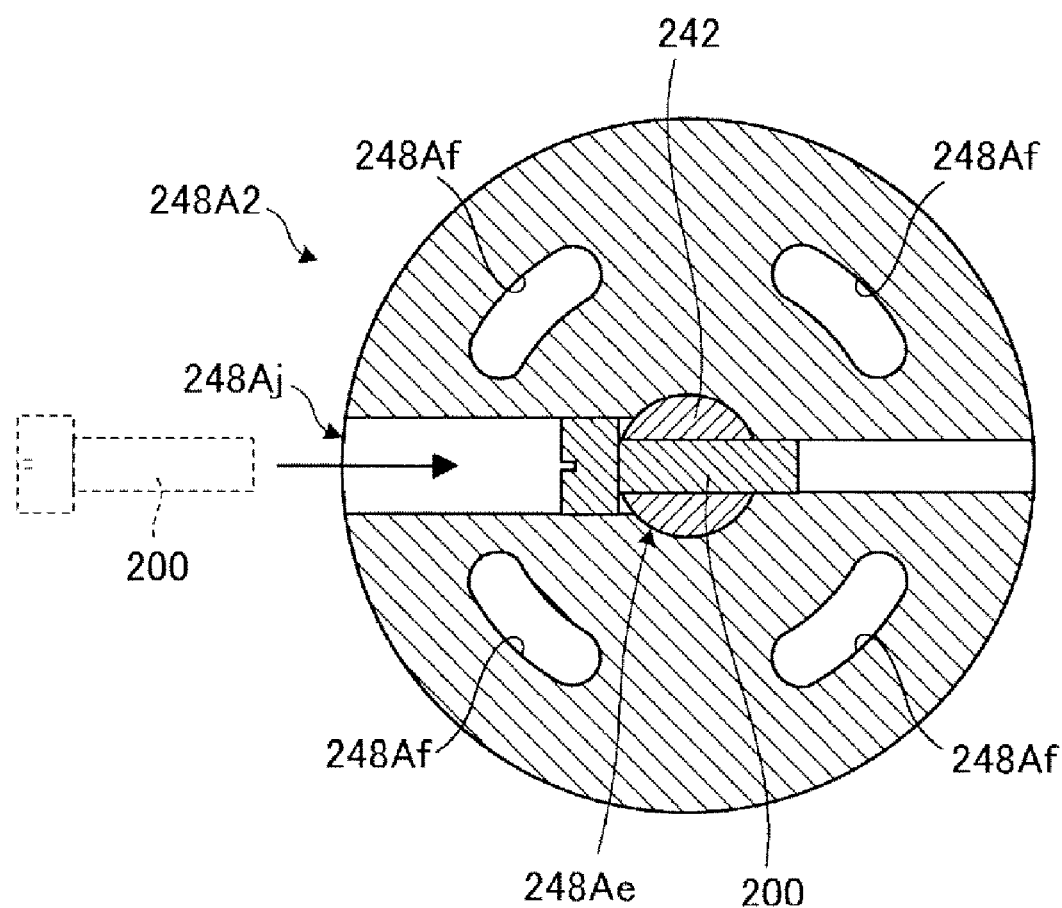
FIG. 15 is a schematic cross sectional view taken along a line A-A of FIG. 13.

Now, a configuration of a rear surface cleaning unit according to a second exemplary embodiment will be explained with reference to FIG. 13 to FIG. 15. FIG. 13 is a schematic side view illustrating the rear surface cleaning unit according to the second exemplary embodiment. FIG. 14 is a schematic perspective view illustrating a guide member and a rear surface brush according to the second exemplary embodiment. FIG. 15 is a schematic cross sectional view taken along a line A-A of FIG. 13. Further, in the following description, the same parts as already described above will be assigned same reference numerals, and redundant description will be omitted.

As illustrated in FIG. 13 and FIG. 14, the rear surface cleaning unit 204A according to the second exemplary embodiment is equipped with a rear surface brush 241A and a guide member 248A.

The rear surface brush 241A includes a main body 112A, a cleaning body 103 and a liquid receiving member 104. The main body 112A is a cylindrical member and has a hollow portion 113A provided with open top and open bottom. The cleaning body 103 is provided under the main body 112A, and the liquid receiving member 104 is provided at an outer periphery portion of the main body 112A.

The guide member 248A is provided between a discharge portion 247e and the rear surface brush 241A. The guide member 248A is configured to receive a processing liquid discharged from the discharge portion 247e and guide the received processing liquid into the hollow portion 113A of the rear surface brush 241A.

The guide member 248A has a receiving plate portion 248A1 having a circular shape when viewed from the top; and a connecting portion 248A2 having a circular column shape and formed as one body with the receiving plate portion 248A1 at a lower portion of the receiving plate portion 248A1.

The receiving plate portion 248A1 has a receiving surface 248Aa downwardly inclined toward a spindle 242 from a position distanced away from the spindle 242 farther than the discharge portion 247e is distanced away from the spindle 242 in a diametrical direction of the spindle 242.

The receiving surface 248Aa is provided with a multiple number of inlet openings 248Ab, a first wall portion 248Ac and a second wall portion 248Ad.

The inlet openings 248Ab are arranged in a circumferential direction at positions closer to the spindle 242 than the discharge portion 247e. In the diametrical direction of the spindle 242, the first wall portion 248Ac (an example of a surrounding wall portion) is provided at a position distanced away from the spindle 242 farther than the discharge portion 247e is distanced away from the spindle 242, and is protruded upwards to surround the receiving surface 248Aa. The second wall portion 248Ad is provided between the inlet openings 248Ab and the spindle 242, and is protruded upwards.

A lower portion of the connecting portion 248A2 is connected to the main body 112A of the rear surface brush 241A. To elaborate, a cylindrical engagement portion 248Ah to be engaged with an upper portion 112A1 of the main body 112A is formed at a lower portion of the connecting portion 248A2. The engagement portion 248Ah has a diameter larger than that of the upper portion 112A1 of the main body 112A, and is engaged with the upper portion 112A1 of the main body 112A from the outside. As the main body 112A is connected to the connecting portion 248A2, an internal space 248Ai communicating with an upper opening 113Aa of the hollow portion 113A is formed within the connecting portion 248A2.

A multiple number of internal flow paths 248Af is provided within the connecting portion 248A2. At an upstream side, the internal flow paths 248Af respectively communicate with the inlet openings 248Ab provided at the receiving surface 248Aa, and, at a downstream side, the internal flow paths 248Af respectively communicate with the outlet openings 248Ag opened to the internal space 248Ai. These internal flow paths 248Af guide the processing liquid received by the receiving surface 248Aa into the hollow portion 113A.

Further, the connecting portion 248A2 includes a first insertion hole 248Ae and a second insertion hole 248Aj (see FIG. 15). The first insertion hole 248Ae is extended along the vertical direction and is provided at a central portion of the connecting portion 248A2. The spindle 242 is inserted into this first insertion hole 248Ae. Further, as shown in FIG. 15, the second insertion hole 248Aj is extended along the horizontal direction, and a fastening member 200 is inserted into this second insertion hole 248Aj. The second insertion hole 248Aj is provided not to interfere with the internal flow paths 248Af.

By inserting the spindle 242 into the first insertion hole 248Ae and the fastening member 200 into the second insertion hole 248Aj, the spindle 242 and the guide member 248A are fixed by the fastening member 200. Accordingly, the rear surface brush 241A is fixed to the spindle 242 with the guide member 248A therebetween. The fastening member 200 is, by way of example, but not limitation, a bolt, and by screwing this bolt into a nut portion formed at the spindle 242, the guide member 248A is fixed to the spindle 242. In FIG. 15, illustration of thread grooves formed at the fastening member 200 and the nut portion of the spindle 242 is omitted.

Now, a flow of the processing liquid in the rear surface cleaning unit 204A according to the second exemplary embodiment will be explained. The processing liquid discharged from the discharge portion 247e is received by the receiving surface 248Aa of the guide member 248A, and, then, is gathered toward the spindle 242 and flown into the internal flow paths 248Af through the inlet openings 248Ab. Thereafter, the processing liquid is discharged from the outlet openings 248Ag after passing through the internal flow paths 248Af. After the processing liquid discharged from the outlet openings 248Ag is guided to the upper opening 113Aa of the hollow portion 113A of the rear surface brush 241A through the internal space 248Ai of the guide member 248A, the processing liquid is gathered toward the spindle 242 and then is discharged toward the wafer W from a lower opening 113Ab of the hollow portion 113A.

As stated above, the processing liquid discharged from the discharge portion 247e is guided into the hollow portion 113A of the rear surface brush 241A through the internal flow paths 248Af provided within the guide member 248A. Accordingly, the atmosphere of the processing liquid can be suppressed from leaking to the outside while the processing liquid reaches the hollow portion 113A from the receiving surface 248Aa. Therefore, in case that the processing liquid is a chemical liquid such as SC-1 or DHF, the atmosphere of the chemical liquid can be suppressed from leaking to the outside and damaging the wafer W while the chemical liquid reaches the hollow portion 113A from the discharge portion 247e.

Furthermore, the atmosphere of the processing liquid can be suppressed from leaking to the outside by the first wall portion 248Ac provided at an outer periphery portion of the receiving surface 248Aa until it reaches the receiving surface 248Aa from the discharge portion 247e.

Additionally, by providing the internal flow paths 248Af, the processing liquid is suppressed from being rotated and scattered out while the processing liquid reaches the hollow portion 113A from the receiving surface 248Aa. Thus, as compared to a case where the internal flow paths 248Af are not provided, it is possible to supply the processing liquid into the rear surface brush 241A at a higher flow rate. Further, though the processes shown by the flowchart of FIG. 12 are described for an example case where the chemical liquid or the rinse liquid is supplied from both of the nozzle 251 (261) and the rear surface brush 241, there may be another example case where the chemical liquid or the rinse liquid is supplied only from the rear surface brush 241. In such a case, the rear surface brush 241A of the second exemplary embodiment has an advantage in that it is capable of supplying the processing liquid at a higher flow rate.

As stated above, the guide member 248A according to the second exemplary embodiment is provided with the internal flow paths 248Af which are provided within the connecting portion 248A2 and configured to guide the processing liquid received by the receiving surface 248Aa into the hollow portion 113A. Accordingly, the atmosphere of the processing liquid can be suppressed from leaking out to the outside.

Moreover, the above second exemplary embodiment has been described for the case where the guide member 248A is provided with the multiple inlet openings 248Ab, the multiple internal flow paths 248Af and the multiple outlet openings 248Ag. However, it is also possible that the guide member 248A has at least a single inlet opening 248Ab, a single internal flow path 248Af and a single outlet opening 248Ag.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate cleaning apparatus, comprising:
   a substrate holding unit configured to hold a substrate rotatably;
   a brush having a main body, a cleaning body provided at a lower portion of the main body and configured to be pressed onto the substrate, and a hollow portion formed in the main body and provided with an open top and an open bottom, and a protruding member protruded from the outer periphery portion of the main body to an outward direction and configured to suppress a scattering of a processing liquid dispersed from the brush;

an arm configured to rotatably support the main body of the brush with a spindle therebetween;

a discharge portion provided at the arm; and a guide member provided between the discharge portion and the brush, and configured to receive the processing liquid discharged from the discharge portion and guide the received processing liquid into the hollow portion of the brush, wherein plural kinds of processing liquids are discharged from the discharge portion while being switched, and the protruding member has a hood-shaped top surface which is downwardly inclined in the outward direction.

2. The substrate cleaning apparatus of claim 1, wherein the discharge portion is provided at a position distanced away from the spindle farther than the hollow portion is distanced away from the spindle, and the guide member comprises:

a receiving surface downwardly inclined toward the spindle from a position distanced away from the spindle farther than the discharge portion is distanced away from the spindle; and a drain portion provided at a region of the receiving surface located directly above the hollow portion and configured to drain the processing liquid toward the hollow portion.

3. The substrate cleaning apparatus of claim 2, wherein the drain portion includes a multiple number of drain openings arranged in a circumferential direction.

4. The substrate cleaning apparatus of claim 1, wherein the discharge portion is provided at a position distanced away from the spindle farther than the hollow portion is distanced away from the spindle, and the guide member comprises:

a connecting portion connected to the brush at a lower portion thereof;

a receiving surface provided at an upper portion of the connecting portion and downwardly inclined toward the spindle from a position distanced away from the spindle farther than the discharge portion is distanced away from the spindle; and one or more internal flow paths provided within the connecting portion and configured to guide the processing liquid received by the receiving surface into the hollow portion.

5. The substrate cleaning apparatus of claim 4, wherein the guide member has a surrounding wall portion provided at an outer periphery portion of the receiving surface and protruded upwards from the receiving surface.

6. The substrate cleaning apparatus of claim 1, wherein, among the plural kinds of the processing liquids, a first processing liquid is discharged from the discharge portion, and then, a second processing liquid is continuously discharged from the discharge portion.

7. The substrate cleaning apparatus of claim 6, wherein a first chemical liquid as the first processing liquid is discharged from the discharge portion, and then, pure water as the second processing liquid is continuously discharged from the discharge portion, and thereafter, a second chemical liquid as a third processing liquid among the plural kinds of the processing liquids is discharged from the discharge portion.

8. The substrate cleaning apparatus of claim 1, wherein pure water is discharged from the discharge portion in a state that the brush is located at a retreat position.

9. The substrate cleaning apparatus of claim 1, further comprising:

a nozzle configured to supply at least one kind of processing liquid among the plural kinds of the processing liquids;

a nozzle arm configured to rotate the nozzle; and a controller configured to control operations of the arm and the nozzle arm, wherein the arm is configured to rotate the brush along a path intersecting with a rotation path of the nozzle arm, and the controller controls the arm and the nozzle arm to be concurrently rotated at the same speed when the arm and the nozzle arm are returned back to initial positions immediately after power is on.

\* \* \* \* \*